United States Patent
Miklinski et al.

(10) Patent No.: US 9,820,416 B2
(45) Date of Patent: Nov. 14, 2017

(54) SHIELDING CAGE FOR CLOSELY SPACED CAGE ARRAYS

(71) Applicant: Molex, LLC, Lisle, IL (US)

(72) Inventors: Richard Miklinski, Lisle, IL (US); Kenneth Janota, Lisle, IL (US); Michael Alan Johnston, Lisle, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/778,483

(22) PCT Filed: Mar. 18, 2014

(86) PCT No.: PCT/US2014/031014
§ 371 (c)(1),
(2) Date: Sep. 18, 2015

(87) PCT Pub. No.: WO2014/153335
PCT Pub. Date: Sep. 25, 2014

(65) Prior Publication Data
US 2016/0295751 A1    Oct. 6, 2016

Related U.S. Application Data

(60) Provisional application No. 61/803,719, filed on Mar. 20, 2013.

(51) Int. Cl.
*H01R 13/659* (2011.01)
*H05K 7/14* (2006.01)
(Continued)

(52) U.S. Cl.
CPC ......... *H05K 9/0009* (2013.01); *G02B 6/4261* (2013.01); *G02B 6/4277* (2013.01); *H01R 13/5202* (2013.01); *H01R 13/659* (2013.01); *H05K 5/0021* (2013.01); *H05K 5/0204* (2013.01); *H05K 7/14* (2013.01); *H05K 9/0058* (2013.01)

(58) Field of Classification Search
CPC .. H05K 9/00; H05K 5/02; H05K 7/14; H05K 5/00; H05K 9/0009; H05K 5/0021; H05K 5/0204; H01R 13/52; H01R 13/659; H01R 13/5202
USPC .............. 174/378; 439/607.2, 607.01
See application file for complete search history.

(56) References Cited

U.S. PATENT DOCUMENTS 6,351,394 B1 * 2/2002 Cunningham ....... G02B 6/4277
                                                  174/375
6,612,868 B2 * 9/2003 Hwang ............ H01R 13/65802
                                                  385/92
(Continued)

FOREIGN PATENT DOCUMENTS

JP          07-007193 U      1/1995

*Primary Examiner* — Michael F McAllister
(74) *Attorney, Agent, or Firm* — Jeffrey K. Jacobs

(57) ABSTRACT

A shielding cage with an improved construction is disclosed that permits such cages to be more closely spaced together when a plurality of them are arranged in side-by-side arrays of cages. The cage is formed from a sheet metal blank that is stamped and formed to define sidewalls, top wall, bottom wall and a rear wall. In one embodiment, the ends of the blank are formed with interengaging elements in the form of tabs and slots that interfit within the plane of one of the cage walls, thereby eliminating the need for projections disposed on the sidewalls of the cage.

11 Claims, 13 Drawing Sheets

(51) Int. Cl.
*H05K 9/00* (2006.01)
*H01R 13/52* (2006.01)
*G02B 6/42* (2006.01)
*H05K 5/00* (2006.01)
*H05K 5/02* (2006.01)

(56) References Cited

U.S. PATENT DOCUMENTS

| | | | |
|---|---|---|---|
| 6,780,053 B1* | 8/2004 | Yunker | G02B 6/4201 |
| | | | 439/607.2 |
| 7,758,381 B2 | 7/2010 | Oki | |
| 2004/0216909 A1 | 11/2004 | Lloyd et al. | |
| 2007/0128937 A1* | 6/2007 | Long | H01R 13/65802 |
| | | | 439/607.01 |
| 2008/0047746 A1* | 2/2008 | Chen | H05K 9/0058 |
| | | | 174/369 |
| 2009/0050360 A1* | 2/2009 | Chen | H05K 9/0058 |
| | | | 174/351 |
| 2013/0072063 A1* | 3/2013 | Qiao | H01R 13/65802 |
| | | | 439/607.01 |
| 2013/0206469 A1* | 8/2013 | Cantrell | H01R 13/6584 |
| | | | 174/358 |

\* cited by examiner

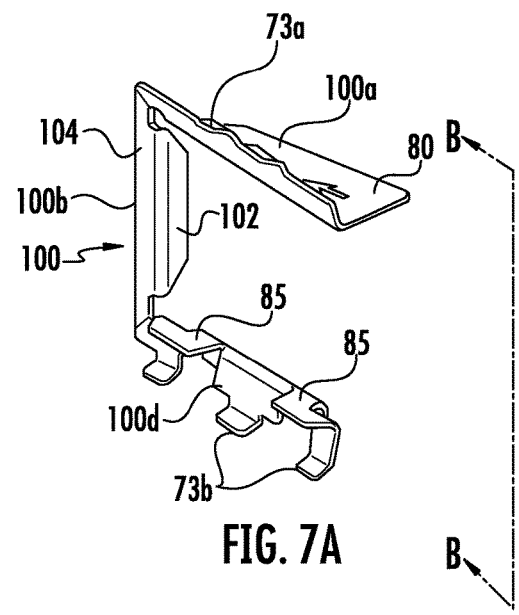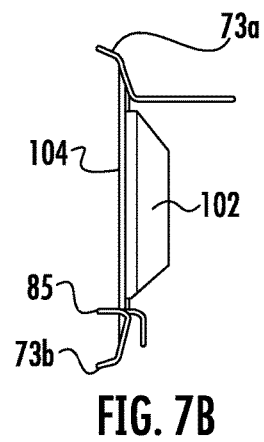
FIG. 7A    FIG. 7B
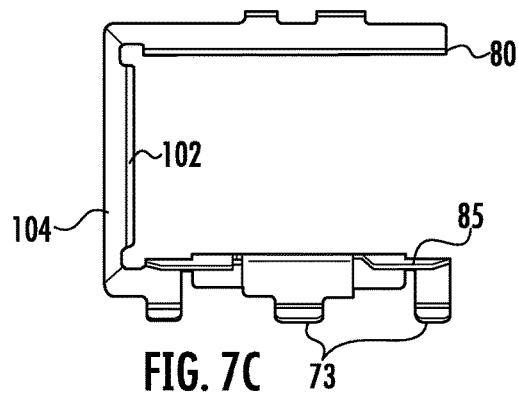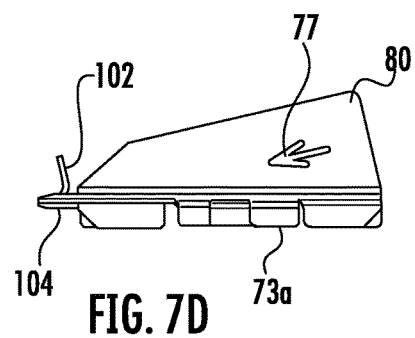
FIG. 7C    FIG. 7D

SHIELDING CAGE FOR CLOSELY SPACED CAGE ARRAYS

CROSS REFERENCE TO RELATED APPLICATIONS

The Present Disclosure is a national phase of PCT Application No. PCT/US2014/031014, filed Mar. 18, 2014, which in turn claims priority to U.S. Provisional Patent Application No. 61/803,719, entitled "Shielding Cage For Closely Spaced Cage Arrays," filed on 20 Mar. 2013, and which is incorporated herein by reference in its entirety.

BACKGROUND OF THE PRESENT DISCLOSURE

The Present Disclosure relates generally to shielding cages that house electronic modules, and, more particularly, to cages of improved construction that permit cages in arrays of cages to be more closely spaced together, without sacrificing integrity of the cage construction, thereby saving space on circuit boards to which the cages are mounted.

Electronic modules are terminated to ends of cables to permit the cables to connector to board mounted receptacle connectors. The modules operate at high data transfer speeds and, as such, shielding is required at the module-connector mating interface to prevent the excessive emission of electromagnetic interference ("EMI"). Cages are therefore stamped and formed from sheet metal. The cages typically are formed from either a single sheet or two metal sheets. With the two pieces construction, the cage top is separately formed and attached to a cage body. Tabs formed on the sidewalk of the cage body engage opening formed in the cage top. The tabs project outwardly from the cage body sidewalls. In one-piece construction, a portion of the cage top is folded over one of the cage body sidewalls and the aforementioned tab-opening structure is used to hold the two ends of the metal sheet together. In both instances, the engagement tabs project outwardly and inhibit the ability for a designer to mount cages closely adjacent to each other on a circuit board. Additionally, the sheet metal from which present cages are made is relatively thick and when the similar thickness material is used to make EMI gaskets for the cage, the thickness prevents close spacing. As such, single port cages are not designed to allow them to be spaced very closely together, and designers are forced to use ganged cage designs which utilize more parts and are more costly.

Space on a circuit board is valuable and designers seek to constantly increase the number of electronic components while either maintaining the size of the circuit board or reducing its size. Accordingly, a need exists for a single cage having a design that permits it to be closely spaced together in cage arrays, and in particular, angled cage arrays without wide gaps between adjacent cages that permit EMI leakage.

The Present Disclosure is therefore directed to a shielding cage construction particularly suitable for use in shielding cage arrays in which the cages are more closely spaced together, without sacrificing the structural integrity of the shielding cage.

SUMMARY OF THE PRESENT DISCLOSURE

Accordingly, there is provided a shielding cage suitable for use in multiple mounting arrays of shielding cages, such as in a 1×2, 1×4, 1×6 and the like. The cage structure is modified so that it may be formed from a single piece of conductive material, preferably sheet metal, without utilizing any engagement elements positioned on or along the sidewalks of the shielding cage, which project outwardly therefrom, that interfere with the ability to mount shielding cages closely adjacent to each other in an array.

In accordance with an embodiment described in the Present Disclosure, the shielding cage is formed from a single sheet of thin blank conductive material, such as sheet metal. The blank is folded over in a fashion to define a plurality of walls that cooperatively define a hollow enclosure dimensioned to receive an electronic module therein. In this embodiment a rectangular hollow enclosure is defined and the blank includes separate sidewalk, top wall and bottom wall. The bottom wall is formed by engaging together opposing ends of the conductive blank in a manner such that none of the engagement elements are disposed on the sidewalls of the finished cage.

The opposing ends of the conductive blank may be considered as having a plurality of interengaging elements, preferably equal in number, to define engagement members in the form of tabs along one end of the blank and engagement members in the form on slots along the other, opposing end of the blank so that the engagement members engage each other in a common plane defined by the bottom wall of the shielding cage. Preferably, some of the edges of the engagement members are angled to provide increased retention. The engagement tabs may have a configuration that approximates an edge with at least one of the sides of the tabs extending at an angle from the sidewall and in the plane of the bottom wall. The cage sidewalk may be provided with a plurality of mounting legs in the form of compliant, or press-fit, pins that extend downwardly from the sidewalk in the plane of the sidewalk. The engagement tabs of one end of the cage blank may be slotted to permit the mounting legs to pass through and if desired, engage the side edges of the mounting legs.

The engagement tabs and slots hold the opposing ends of the blank together reliably in a common plane. The tabs and slots may be further configured in the manner of interengaging teeth or a jigsaw or dovetail configuration. The sidewalk of the cage blank may be provided with EMI contacts formed integrally therein for contacting adjacent cages. Additionally, the mounting pins of the cage are modified to remove selected pins so that they will not interfere with each other in mounting holes drilled in the circuit board for the cage array. Cages constructed in accordance with the Present Disclosure have obtained a reduction in about 80% of the standard cage separation width of about 1.516 mm.

Still further, as described in an embodiment herein, the manner in which the rear wall of the shielding cage is attached to the two sidewalls of the cage involves moving the location of engagement tabs formed on the cage sidewalk further in from the sides of the rear wall so there is no excessive projections that occur along the engagement areas of the cage rear wall. Gasket frames are also provided, one frame in association with each shielding cage of the Present Disclosure and these frames are formed to maintain the close spacing of the cages. One such frame is formed with four sides that encircle the shielding cage and additional, associated frames are formed with only three sides and one open side so that the open side can mate with the frame of an adjacent shielding cage and only one thickness of the frames is present between the adjacent shielding cages.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 4A is the same view as FIG. 4A, but with the gasket frame removed for clarity;

FIG. 7A is a perspective view of the gasket frame member used in association with the secondary shielding cage of FIG. 5A;

FIG. 7B is a side elevational view thereof, taken along Line B-B of FIG. 7A;

FIG. 7C is a front elevational view of the gasket frame member of FIG. 7A;

FIG. 7D is a top plan view of the gasket frame member of FIG. 7A;

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
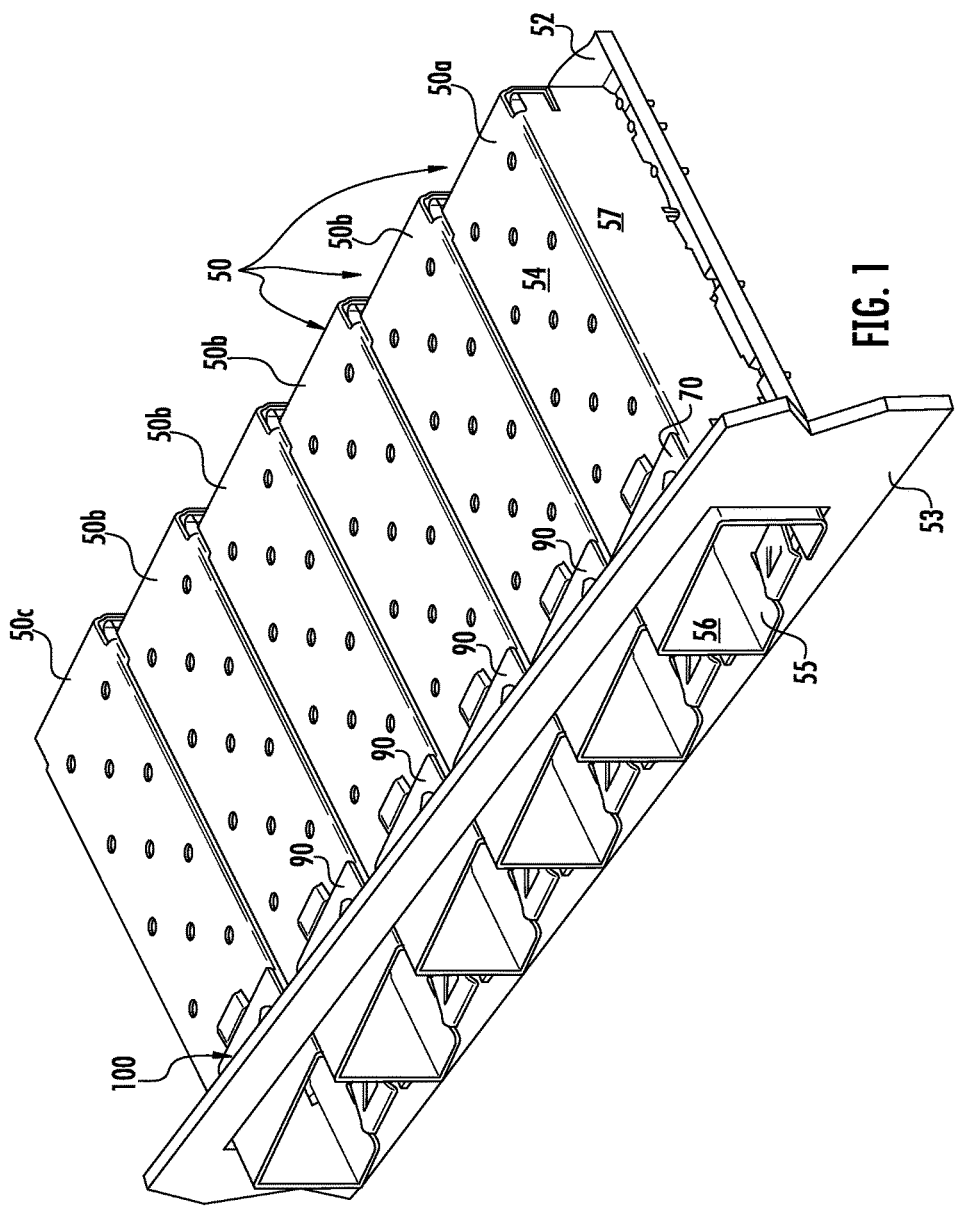
FIG. 1 illustrates an array of shielding cages constructed in accordance with the Present Disclosure with gasket frames mounted thereto an inserted into a bezel opening.

FIG. 1 is a perspective view of an array of shielding cages 50 constructed in accordance with the Present Disclosure and arranged in an angled array upon a circuit board 52 and projecting partially through an exterior bezel, or panel, 53. The cages 50 are rectangular in configuration, having a top wall 54, a bottom wall 55, two opposing sidewalls 56, 57 and a rear wall 58. The walls 54-58 cooperatively define an interior, a hollow enclosure configured to accommodate an electronic module therein. Each cage 50 further preferably includes an exterior gasket frame, explained below, that sits on the exterior of the cage 50 and extends around three to four of the cage walls. The gasket frame engages a flexible EMI gasket 72 interposed between the gasket frames 70 and the rear face of the bezel 53. Similarly, the gasket frames 70 preferably engage each other and provide a means for reducing EMI between adjacent cages 50.

The cages 50 are arranged in a particular fashion with a "primary" cage 50a being disposed at one end of the array, shown at the rightmost end of the array in FIG. 1. This cage is called a primary cage because, as explained below, it has a gasket frame 70 associated with it that extends around all four walls of the shielding cage 50a. A plurality of secondary shielding cages 50b, 50c are arranged in side-by-side order adjacently outwardly from the primary shielding cage 50a. The leftmost secondary shielding cage 50c defines the left end of the array of FIG. 1.

Figure 13:
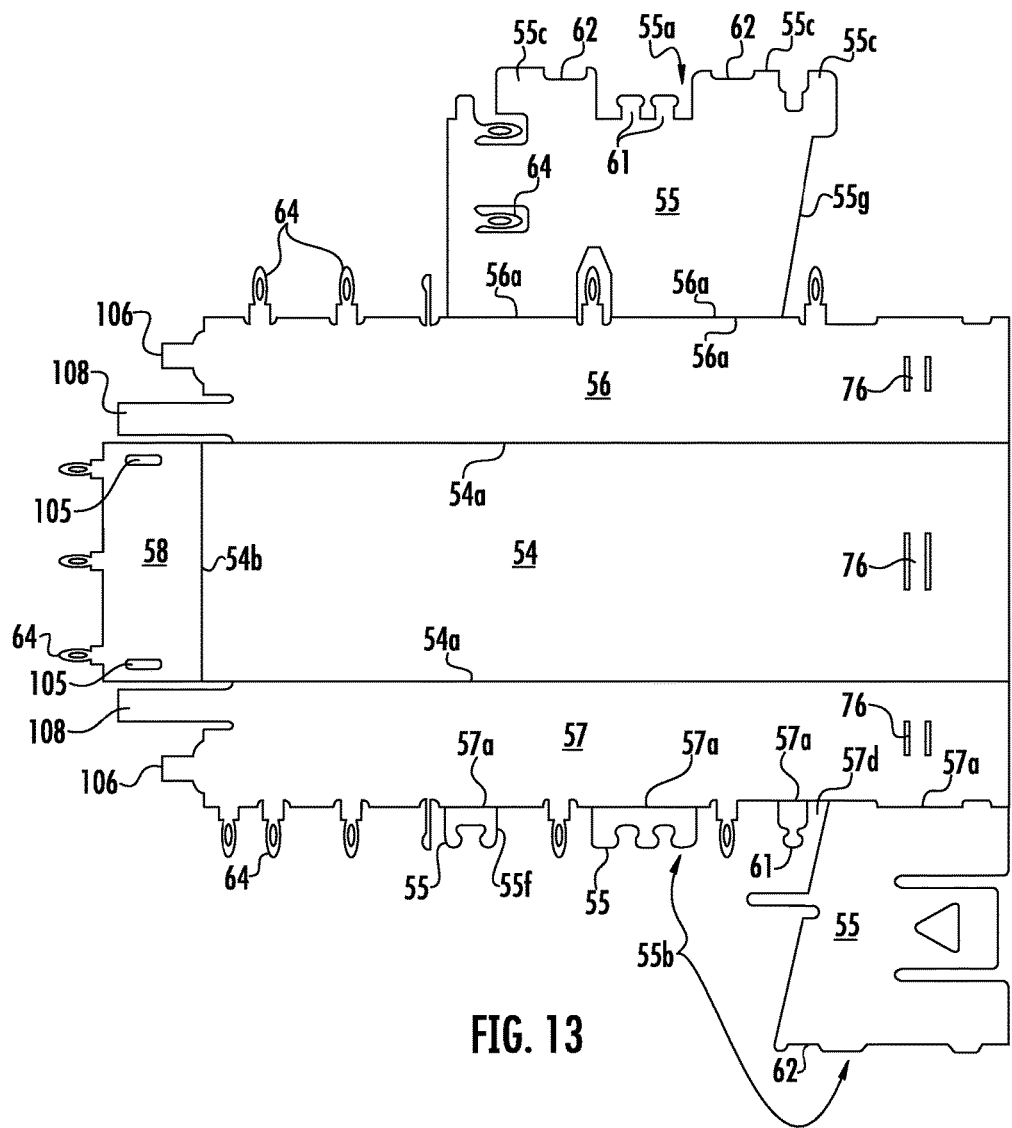
FIG. 13 is a plan view of a metal blank stamped to define the basic structural elements of the shielding cage but not yet formed into a three-dimensional shielding cage.

Turning to FIGS. 3A-C and 4A-B, the cages of the Present Disclosure may be easily stamped and formed from a single sheet of conductive material, such as a sheet metal blank (FIG. 13.) The blank may be stamped and then formed along fold lines that define boundaries between the respective walls of the cage 50. In the particular embodiment illustrated, the two sidewalls 56, 57 are bent downwardly along fold lines 54a while the rear wall 58 is bent downwardly along a rear fold line 54b. The bottom wall 55 is formed by bending the two sidewalk further along bottom fold lines 56a, 57a, to define two opposing ends 55a, 55b that interengage each other. This is best illustrated in FIG. 10 where one of the opposing ends 55b is highlighted by shading.

Figure 10:
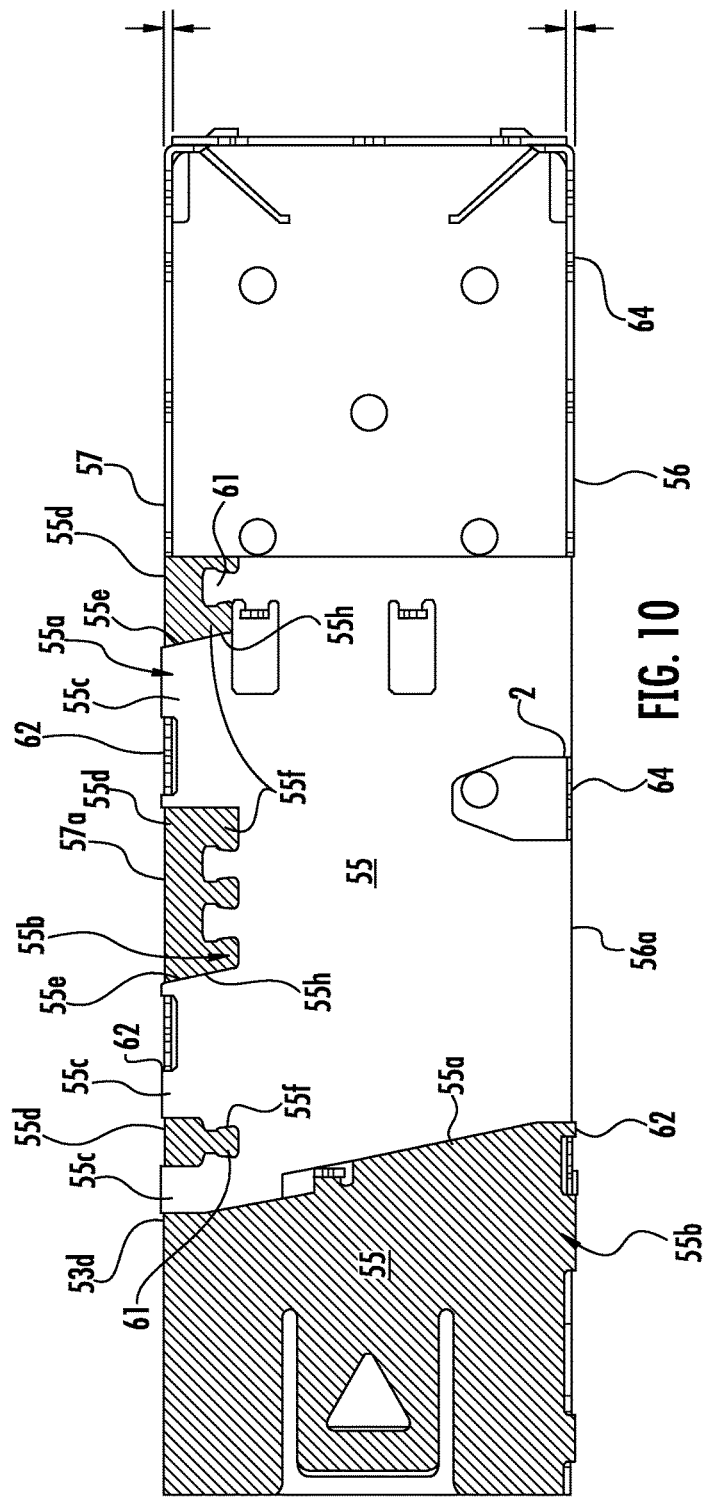
FIG. 10 is a bottom plan view of the shielding cage of FIG. 3A with one of the ends of the sheet metal blank that defines the bottom wall of the cage, shaded for clarity.

Continuing with FIG. 10, the opposing ends 55a, 55b of the metal blank that form the bottom wall 55 of the cage 50 are irregular in shape and may best be described as including tabs 55c formed along the one opposing end 55a that fit into complimentary shaped slots 55d formed along the other opposing end 55b. Likewise, the other opposing end 55b has slots 55e defined between its tabs 55c and which receive tabs 55f that are formed along the other opposing end 55b. The opposing ends 55a, 55b further include angled edges 55g, 55h to enhance the engagement between the two bottom wall, blank ends 55a, 55b. In conventional shielding cages, the blank was formed to define a free end along a top edge of one of the sidewalls and the top wall had a wing portion that extended over the sidewall. The sidewall of such a cage had engagement lugs formed therein and which projected outwardly to create a series of catches that fit into slots formed in the top wall wing portion. An additional manner of construction in prior art shielding cages included the use of engagement tabs formed on one wall such as the bottom wall that projected through openings in the sidewall and are bent into contact with an adjoining wall, such as a cage sidewall. These engagement tabs defined projections along the sidewall which also inhibited close spacing of adjacent cages in arrays.

In the shielding cage 50 illustrated, the engagement between the opposing ends occurs in the plane of the bottom wall 55 and any projection of the free ends past the exterior surfaces of the sidewalls 56, 57 is kept to a minimum, thereby permitting closer spacing of adjacent cages. Although illustrated as present, or captured, in the plane of the cage bottom wall 55, the engagement elements may also be captured in the plane of another wall of the cage 50, such as a sidewall 56, 57 thereof, or the engagement elements may be present in two or more distinct planes of respective distinct cage walls, such as the bottom wall 55 and an adjacent sidewall 56, 57. Such projections may occur where the free ends of the tabs 5c of the end 55a terminate at the sidewall fold line, but the extent of the projection is kept to a minimum. The engagement tabs and slots may include additional engagement aspects such as jigsaw, dovetail or similarly shaped engagement elements 61. The bottom wall 55 may further include a plurality of notches 62 that define passages 63 through which mounting pins 64 of the cage 50 may pass. These and the other structural features of the cage 50 are illustrated in FIG. 13, which is a plan view of a metal blank which has been stamped, but not yet formed into the hollow rectangular housing that defines the shielding cage 50. This manner of engagement eliminates the need to utilize projections on the sidewalls of the cage to hold two ends thereof together.

Figure 4A:
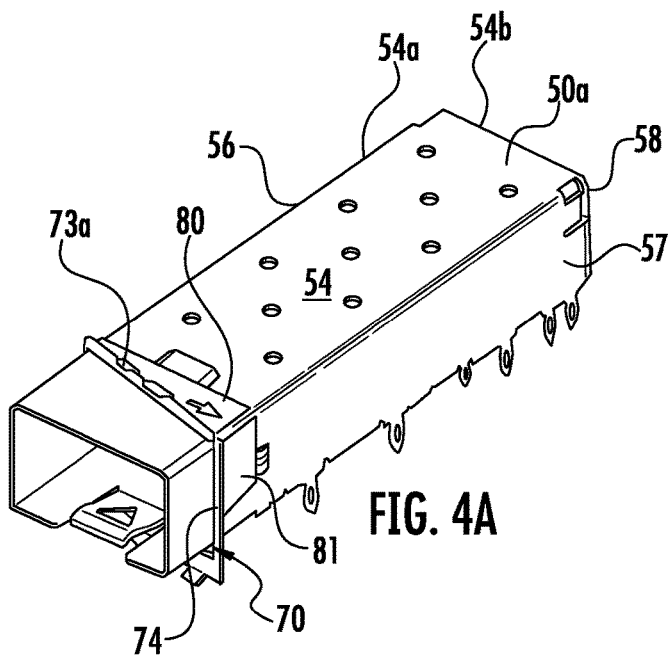
FIG. 4A is a perspective view of the rightmost, primary shielding cage of the array of FIG. 1, with an EMI gasket frame mounted thereon.
Figure 4B:
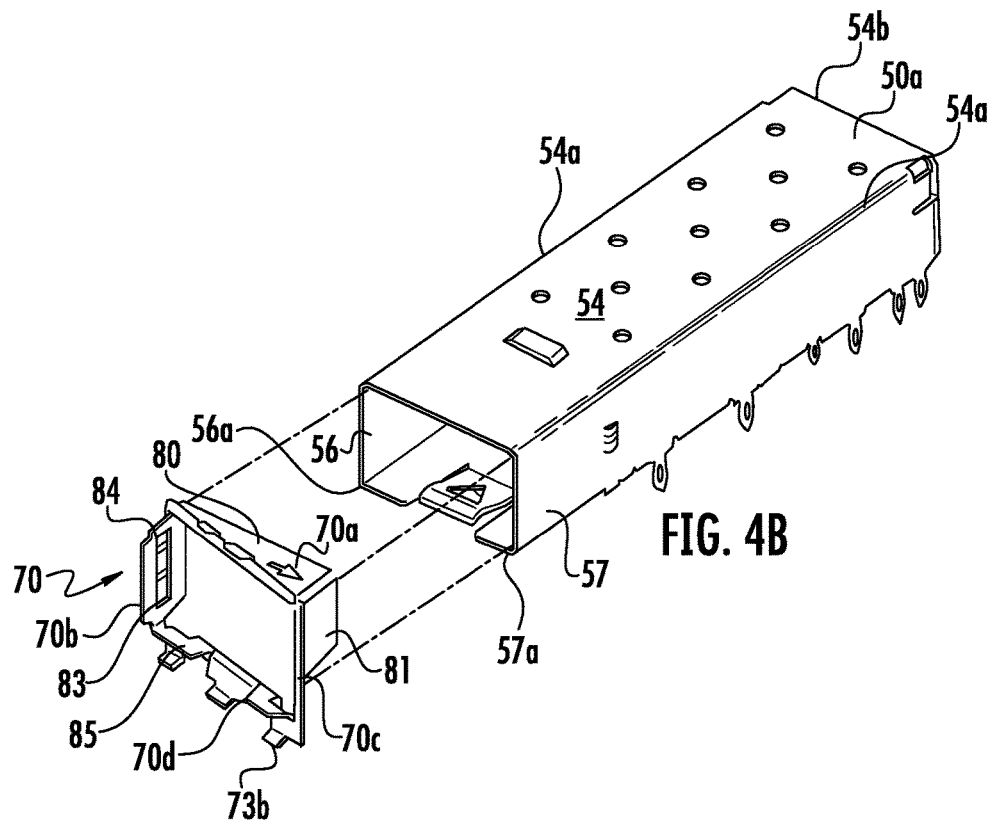
Figure 5A:
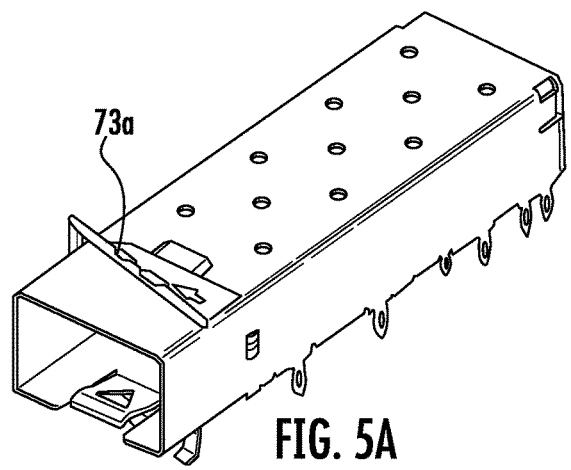
FIG. 5A is a perspective view of the leftmost shielding cage of the cage array of FIG. 1 with an EMI gasket frame mounted thereon.
Figure 5B:
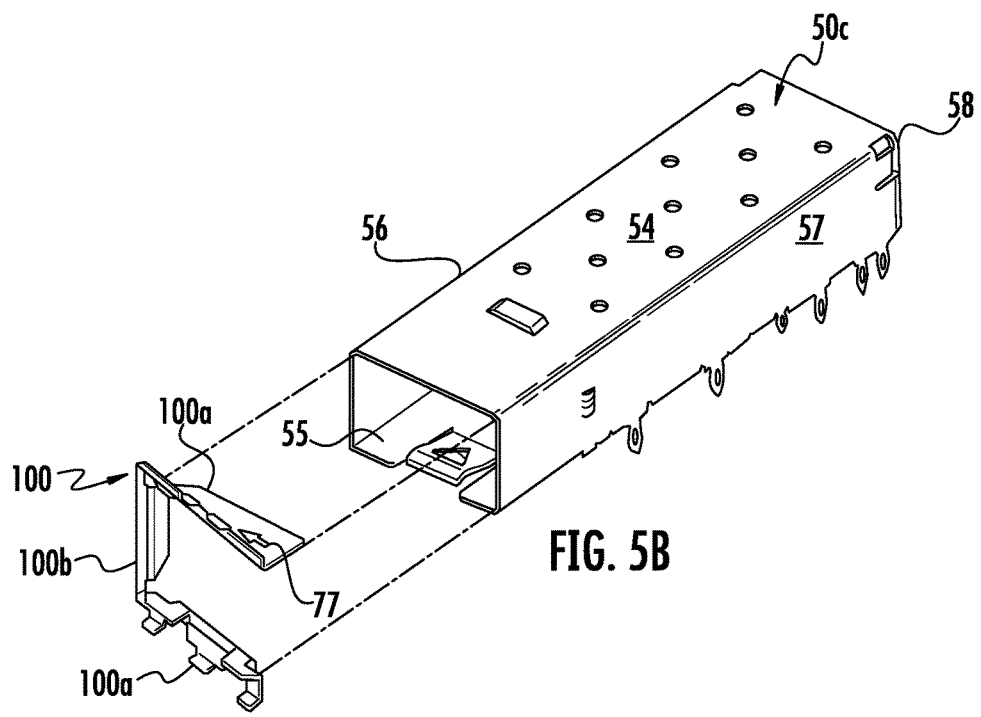
FIG. 5B is the same view as FIG. 5A, but with the gasket frame removed for clarity.
Figure 6A:
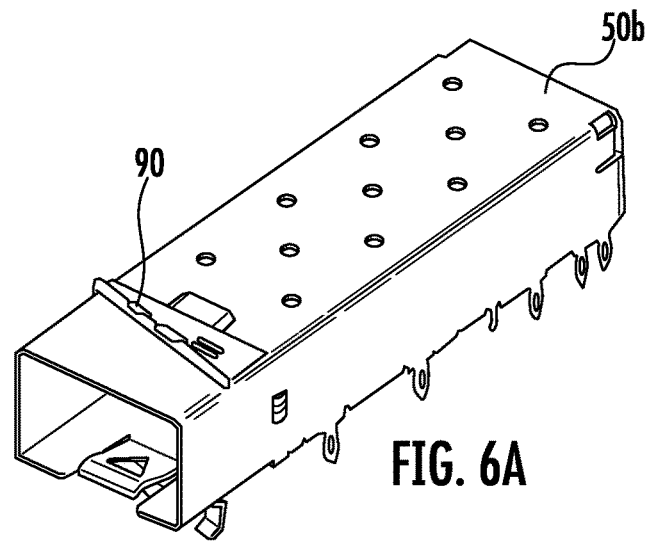
FIG. 6A is a perspective view of the secondary cage adjacent the shielding cage of FIG. 5A in the cage array of FIG. 1 with an EMI gasket frame mounted thereon.
Figure 6B:
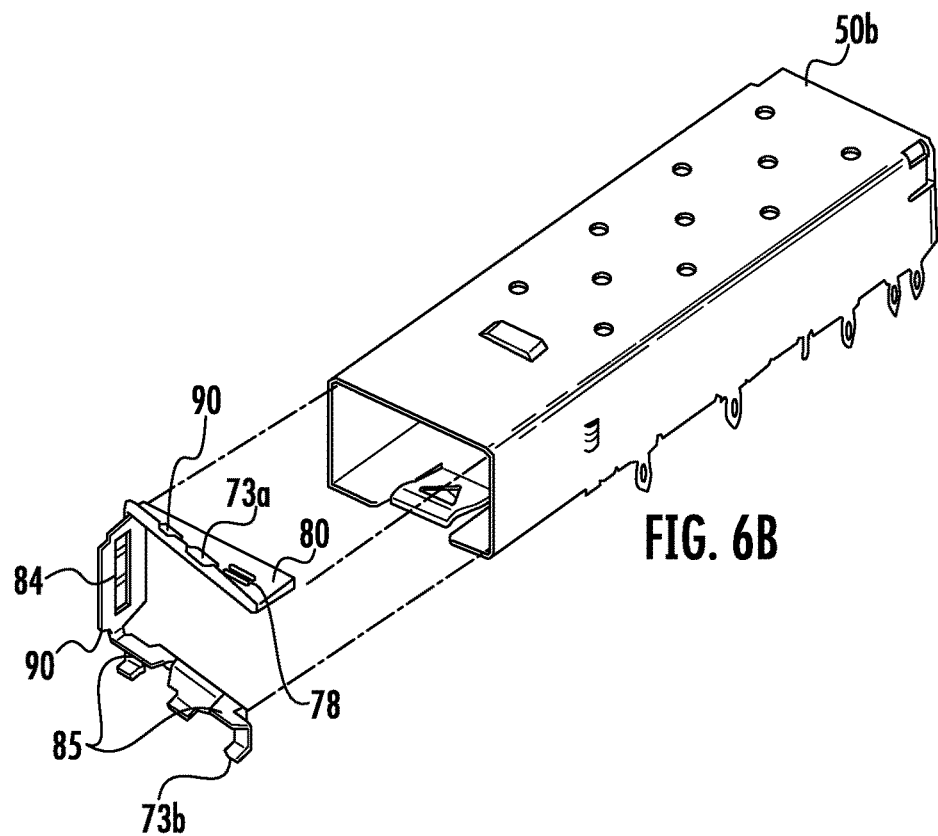
FIG. 6B is the same view as FIG. 6A, but with the gasket frame removed for clarity.
Figure 8A:
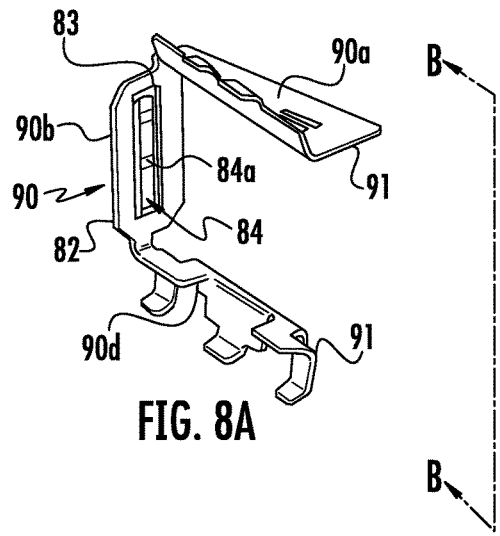
FIG. 8A is a perspective view of the gasket frame member used in association with the secondary shielding cage of FIG. 6A.
Figure 8B:
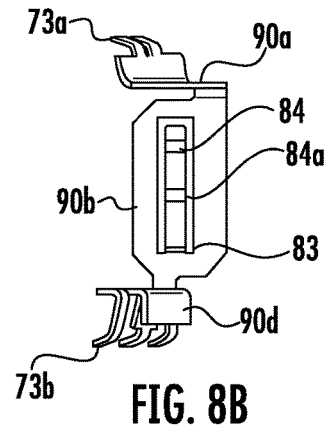
FIG. 8B is a side elevational view thereof, taken along Line B-B thereof.
Figure 8C:
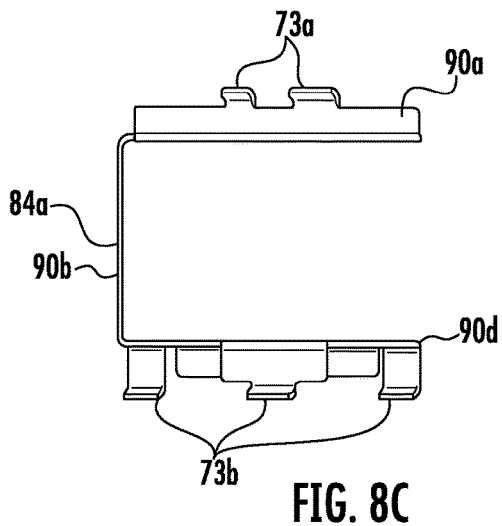
FIG. 8C is a front elevational view of the gasket frame member of FIG. 8A.
Figure 8D:
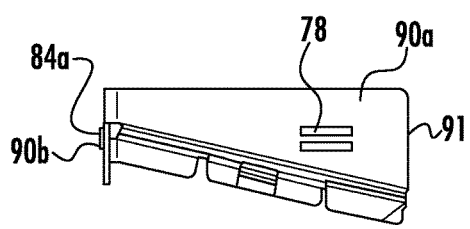
FIG. 8D is a top plan view of the gasket frame member of FIG. 8A.

Turning to FIGS. 4A-B and 9, a gasket frame 70 formed from a conductive material may be provided for one of the cages 50 in the array of cages as shown in FIG. 1. This particular gasket 70 is associated with one of the cages 50 that lie at either end of the cage array and for this particular gasket frame construction, it is the cage at the right end of the cage array, which shall be referred to herein as the "primary" cage of the array. The gasket frame 70 is stamped and formed from a conductive material, preferably sheet metal, so that it defines a collar member that encircles, or envelops, its associated shielding cage 50. In this regard, the gasket frame has four distinct sides 70a-d that cooperatively define a rectangular opening that permits the gasket frame 70 to be slipped over the front part of the primary shielding cage. The gasket frame 70 is continuous, meaning it contacts all four sides of the primary shielding cage.

The gasket frame top side 70a preferably has a wide, angled contact portion 80 that will permit it to be easily welded to the exterior of the shielding cage top wall. The top side 70a is connected, as shown to the left side 70b, which in turn is connected to the bottom side 70d, which is connected to the right side 70c. Two free ends of this gasket frame 70 may be present at opposing ends of the top side 70a and the right side 70c. Once the gasket frame 70 is welded to the exterior of the shielding cage 50, the two free ends are intended will contact each other, thereby forming a continuous contact collar that encircles the shielding cage 50. The right side 70c also has a wide, preferably planar contact portion 81 that extends rearwardly of the front of the gasket frame 70 and which terminates along a Line L-L (FIG. 9D) even with the contact portion 82 of the left side 70b. The left side 70b also has a (preferably planar contact portion 82 that is provided with a U-shaped slot 83 that defines a contact in the form of a spring finger 84 that is formed to project slightly outwardly, such as at contact point 84, in order to contact an adjacent shielding cage. The bottom side 70d has two flat contact portions 85 that contact the exterior surface of the bottom wall 55 of the shielding cage. In this manner, each side 70a-d is provided with respective contact portions that contact the exterior opposing surfaces of the shielding cage sidewalls.

Figure 9A:
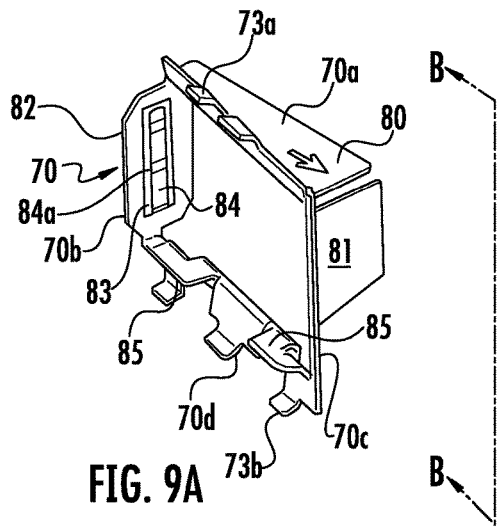
FIG. 9A is a perspective view of the gasket frame member used in association with the primary shielding cage of FIG. 4A.
Figure 9B:
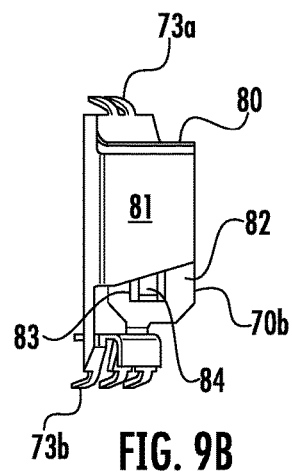
FIG. 9B is a side elevational view thereof, taken along Line B-B thereof.
Figure 9C:
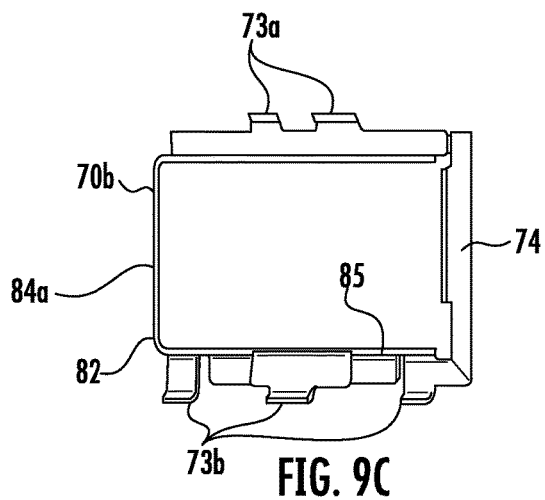
FIG. 9C is a front elevational view of the gasket frame member of FIG. 9A.
Figure 9D:
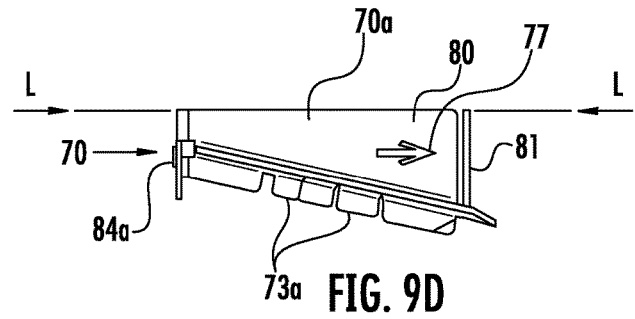
FIG. 9D is a top plan view of the gasket frame member of FIG. 9A.

A conductive elastomeric gasket 72 is provided and is appropriately dimensioned so as to encircle the front portions of a cage array made up of a preselected number of shielding cages arranged adjacent to each other, i.e., in side-by-side order. In order to hold the gasket 72 in place, the gasket frame 70 is preferably provided with a plurality of gasket flanges, or retainers 73a, 73b on at least the top and bottom sides 70a, 70d, respectively. On the gasket frame top side 70a, two such retainers 73a are illustrated in FIGS. 9A-C and these two retainers 73a are spaced apart from each other and are bent up and forwardly to define a channel between them and the exterior top surface of the shielding cage 50 in which the gasket 72 may be held. Likewise, a plurality of gasket retainers 73b are provided along the gasket frame bottom side 70d and are spaced apart (vertically) from the bottom side contact portions 85 to define a similar gasket receiving channel therebetween along the bottom of the shielding cage, generally parallel to the channel on the top of the shielding cage formed by retainers 73a.

As stated previously, a four-sided gasket frame 70 is provided for use with an end, or "primary" cage 50a of a shielding cage array. A different gasket frame is provided for "secondary" shielding cages which are disposed adjacent the primary cage as illustrated. One such gasket frame 90 is illustrated in FIGS. 5A-B and 7A-D. As illustrated best in FIGS. 7A-D, the gasket frame 90 has three sides 90a, 90b and 90d, which are interconnected to provide a generally C-shaped configuration with two free ends 91 in opposition to the primary shielding cage gasket frame 70, and particularly the left side 70b thereof. Preferably, these free ends 91 have a length sufficient to span any gap between the adjacent cages and into contact with the gasket frame 70 of the primary cage 50. The opening between the free ends occurs in the vertical direction where the gasket frame 90 will contact the gasket frame of an adjacent cage. The horizontal sides of the gasket frame are generally parallel to each other and form channels with the retainers 73*a*, 73*b* that receive part of the EMI gasket 72 therein. This gasket frame 90 includes a U-shaped slot 83 in its left side 90*b* and which defines a contact spring in the form of a cantilevered, elastic finger 84 biased slightly outwardly and intended for contact with the exterior surface of the sidewall of an adjacent shielding cage. As with the prior gasket frame 70, this gasket frame left side 90*b* has a planar contact portion 82 surrounding the spring finger 84.

Turning now to FIGS. 5A-B and 7A-D, another gasket frame 100 is illustrated. This style of gasket frame is intended for use on a secondary cage disposed at the opposite, or left end, of a shielding cage array. This gasket frame 100 also has three distinct sides and one opening, giving it a C-shaped configuration. The gasket frame 100, as illustrated in FIGS. 7A-D, includes three distinct sides 100*a*, 100*b*, 100*d* intended to contact the exterior surfaces of the top, left and bottom walls of the leftmost secondary shielding cage to which it is attached. This secondary gasket frame 100 differs from the gasket frame 90 in that its left side 100*b* has a solid lip, or tab, 102, that extends inwardly and rearwardly and into contact with the exterior surface of the shielding cage side wall 56. This tab 102 further includes a flange 104 that extends perpendicularly with respect to the cage sidewall 56, and this flange 104 supports the EMI gasket in a manner similar to the flange 74 of the primary cage gasket frame 70. The two flanges 102 and 104 provide support for the EMI gasket 72 in its vertical extent.

Figure 3A:
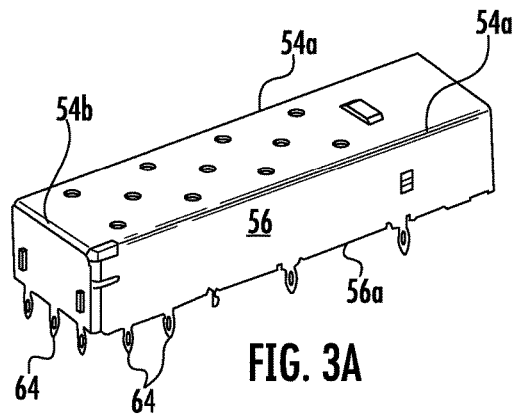
FIG. 3A is a perspective view, taken from the top, of one of the shielding cages of FIG. 1, with the cage gasket removed for clarity.
Figure 3B:
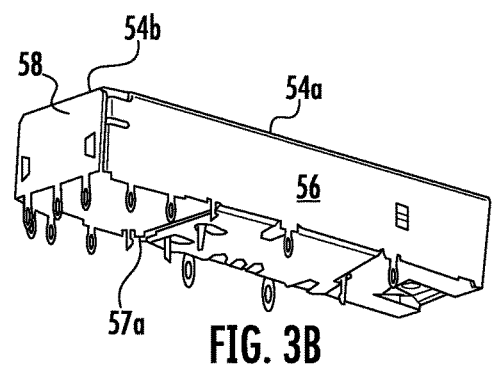
FIG. 3B is a perspective view, taken from below, on the shielding cage of FIG. 3A.
Figure 3C:
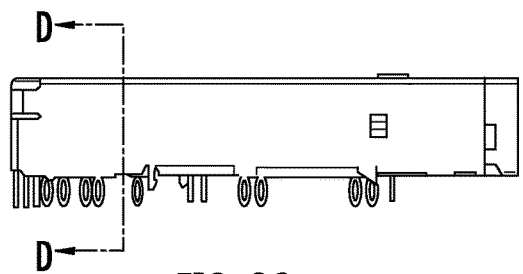
FIG. 3C is a side elevational view of the cage of FIG. 3A.
Figure 3D:
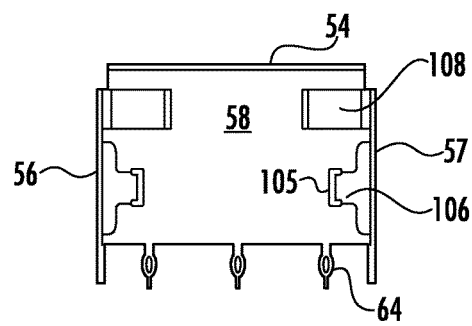
FIG. 3D is a front sectional view of the rear wall of the shielding cage, taken along Line D-D of FIG. 3C.

The shielding cages 50*a-c* are also provided with stop members 76 formed in the cage walls and protrude very slightly outwardly from the exterior surfaces along the top and side walls 54, 56 and 57 of the shielding cages 50. These stop members 76 define a hard edge that opposes and abuts the planar contact portions 80, 81 and 83 of the gasket frames 70, 90 and 100. Visual indicia such as arrows 77, or bars 78, may be applied to the gasket frame top contact portions 80 to facilitate placement of the correct gasket frames on the correct cages. The gasket frames 70, 100 with arrows will be attached to the left and right end cages 50*a*, 50*c* of an array and the gasket frames 90 with bars will be attached to the interior cages 50*b* that lie interior of the two end cages. Referring to FIGS. 3D and 13, it can be seen that the rear wall 58 includes a pair of slots 105 formed therein through which tabs 106 formed on the sidewalk 56, 57 extend from interior of the cage 50. The tabs 106 extend out through the rear wall 58 and are bent over along the exterior surface of the rear wall 58. In this manner, the tabs 106 engage the rear wall 58 at locations within the outer edges of the rear wall 58 so there is no projection portion of the tabs outside the outer edges of the rear wall 58. The base portions of the tabs 106 serve as a surface against which the rear cage wall 58 may contact after assembly. The tabs 106 and slots 105 are disposed on the lower part of the rear wall 58 in order to provide clearance for the two module-engaging spring arms 108 which are shown as formed with the sidewalk 56, 57 and which are bent to extend into the hollow interior of the shielding cage 50 so as to contact any electronic module inserted therein.

Figure 2:
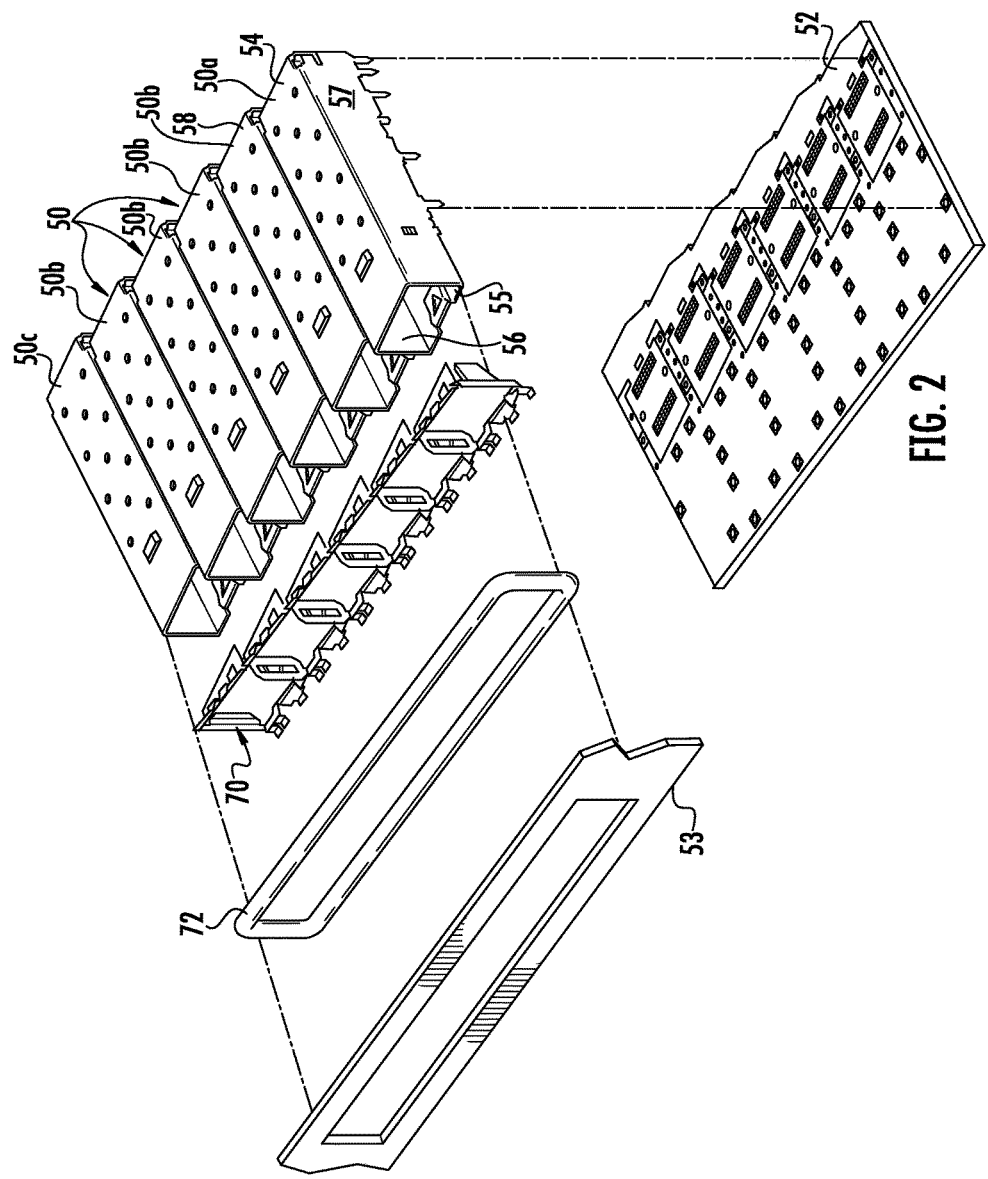
FIG. 2 is an exploded view of the shielding cage array of FIG. 1.
Figure 11:
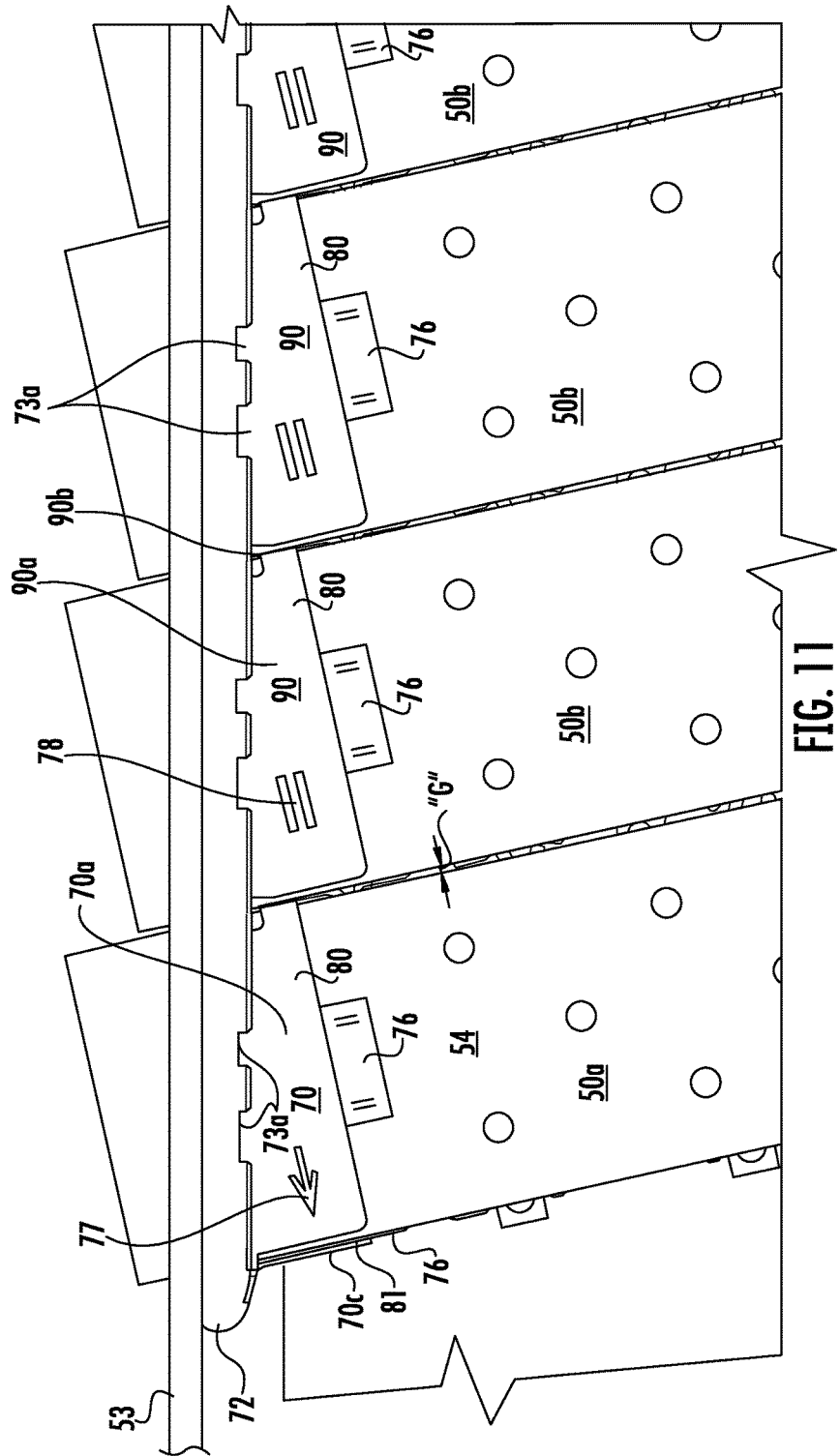
FIG. 11 is an enlarged detail top plan view of the right end of the cage array of FIG. 1 showing the primary shielding cage and three adjacent shielding cages with an EMI gasket in place on the array.
Figure 12:
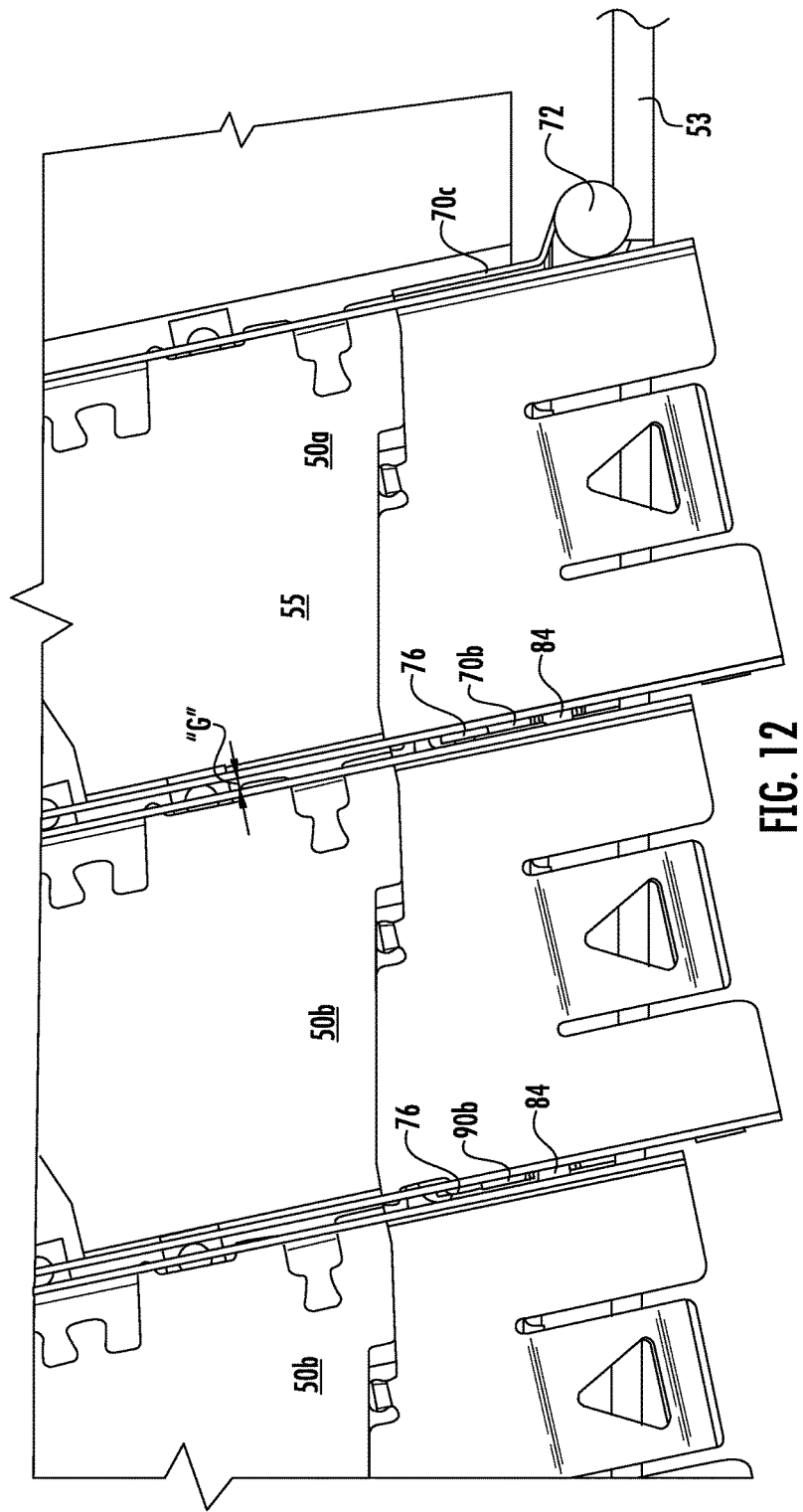
FIG. 12 is a bottom plan view of the cage array of FIG. 11, illustrating the contact that occurs between adjacent shielding cages in the array.

It can be seen that the gasket frames and shielding cages may be sold as a package, or kit of parts, for assembling together an array of shielding cages in a closely spaced arrangement. The gasket frames may be attached to the appropriate cages by welding them at their planar contact portions, and then the cages assembled to the circuit board without interference. It has been found that some of the mounting pins 64 of the cages should be removed and or moved in their location to permit the desired close spacing of about 0.3 mm gap between adjacent cages, as shown by the gap between adjacent cages, "G" in FIGS. 11-2. The gasket frames have a thin thickness that desirably does not exceed 0.2 mm so that the frame side portions can fit in the gap between the cages. The cages of the Present Disclosure have reduced the prior gap of about 1.516 mm down to about 0.3 mm. The use of a single EMI gasket rather than individual EMI gaskets for each cage further assist in reducing the spacing and eliminates the need for individual gaskets. And, as illustrated in FIG. 13, the mounting pins 64 of the cages of the Present Disclosure are arranged along the rear wall and two sidewalls; those along the two sidewalk are staggered with respect to each other to avoid the pins on adjacent cages confronting each other, thereby weakening the integrity of the mounting holes drilled in the circuit board to which the cages are mounted.

Finally, while a preferred embodiment of the Present Disclosure is shown and described, it is envisioned that those skilled in the art may devise various modifications without departing from the spirit and scope of the foregoing Description and the appended Claims.

What is claimed is:

1. A shielding cage, comprising:
   a unitary piece of conductive material formed with a plurality of walls, including at least two opposing sidewalls, the walls cooperatively defining a hollow enclosure for accommodating an electronic module therein, the piece of conductive material having two opposing ends firmly engaged together within a plane defined by at least one of the cage walls, the sidewalls being devoid of members which attach either of the top or bottom walls to said sidewalls; and
   a gasket frame disposed proximate an entrance of the shielding cage and at least partially extending around three walls, each sidewall having an entrance end nearest the entrance of the shielding cage, the gasket frame being disposed at an angle to the entrance of the shielding cage such that the gasket frame is substantially closer to the entrance end of one of the sidewalls than the entrance end of the other sidewall.

2. The shielding cage of claim 1, wherein the cage walls include a top wall, a bottom wall and two sidewalls, the two sidewalls joining the top and bottom walls together to form the hollow enclosure.

3. The shielding cage of claim 2, further including a plurality of mounting pins formed as part of the two sidewalls and disposed in a two row pattern, such that the mounting pins disposed along one of the sidewalls are staggered with respect to the mounting pins disposed along the other of the sidewalls.

4. The shielding cage of claim 1, wherein opposing ends of the conductive material include interengaging engagement members in the form of tab and slot members.

5. The shielding cage of claim 4, wherein said tab and slot members include angled edges.

6. The shielding cage of claim 5, wherein the tab and slot members are formed along the opposing ends.

7. The shielding cage of claim 6, wherein the tab and slot members are engaged proximate a junction of a sidewall and the bottom wall.

8. The shielding cage of claim 7, wherein the gasket frame includes four sides that respectively extend around each wall.

9. The shielding cage of claim 8, wherein at least two walls include a stop member formed therein, each stop member defining an edge that abuttingly engages an edge of one of the gasket frame sides.

10. The shielding cage of claim 8, wherein the gasket frame includes an EMI contact spring member formed along a vertical one of the gasket frame sides, the contact spring being biased to project outwardly from its gasket frame.

11. The shielding cage of claim 6, wherein the gasket frame includes gasket retainers disposed on top and bottom sides thereof.

* * * * *